(12) United States Patent
Testin et al.

(10) Patent No.: US 7,529,092 B2
(45) Date of Patent: May 5, 2009

(54) ELECTROMAGNETIC INTERFERENCE SHIELD AND HEAT SINK APPARATUS

(75) Inventors: William John Testin, Indianapolis, IN (US); Scott Allen Rottler, Avon, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 241 days.

(21) Appl. No.: 11/578,623

(22) PCT Filed: Dec. 15, 2004

(86) PCT No.: PCT/US2004/042492

§ 371 (c)(1),
(2), (4) Date: Oct. 16, 2006

(87) PCT Pub. No.: WO2005/107352

PCT Pub. Date: Nov. 10, 2005

(65) Prior Publication Data

US 2007/0206355 A1    Sep. 6, 2007

Related U.S. Application Data

(60) Provisional application No. 60/533,325, filed on Apr. 15, 2004.

(51) Int. Cl.
*H05K 7/20* (2006.01)
*F28F 7/00* (2006.01)
*H04L 9/00* (2006.01)

(52) U.S. Cl. .............. 361/704; 361/707; 361/710; 361/715; 361/818; 165/80.2; 165/185; 380/52

(58) Field of Classification Search ............... 361/704, 361/707–711, 714–715, 720, 818; 165/80.2; 165/185; 380/52
See application file for complete search history.

(56) References Cited

U.S. PATENT DOCUMENTS 6,215,666 B1    4/2001   Hileman et al.
6,278,609 B1 *  8/2001   Suzuki et al. ............... 361/704
6,549,403 B1 *  4/2003   Ovadia et al. ............... 361/692
6,625,041 B1    9/2003   Chen
6,626,689 B1 *  9/2003   Yu .............................. 439/159
2003/0059047 A1  3/2003   Iwamura
2005/0105278 A1 *  5/2005   Shintani ...................... 361/720

FOREIGN PATENT DOCUMENTS

EP    1257162    11/2002
JP    5-135229    6/1993

OTHER PUBLICATIONS

Patent Abstracts Of Japan, vol. 017, No. 519, Sep. 17, 1993 & JP 05-135229 (See Ref. AE).
Search Report Dated Jun. 3, 2005.

* cited by examiner

*Primary Examiner*—Jayprakash N Gandhi
*Assistant Examiner*—Zachary M Pape
(74) *Attorney, Agent, or Firm*—Robert D. Shedd; Joseph J. Opalach; Brian J. Cromarty

(57) ABSTRACT

A combination heat sink and electromagnetic interference shield device is provided for a point of distribution card of a television receiver. The combination POD card heat sink and EMI shield device includes a combined thermal transfer and electromagnetic conduction portion that provides thermal and EM coupling or contact between an enclosure of the POD card and the metal control module enclosure of a television. Configured metalwork of the combination heat sink and EMI shield device provides conduction of heat from the POD card to provide the heat sink and short circuiting of developed currents to provide EMI shielding. The combined thermal transfer and EM conduction portion provides a low impedance connection between the POD card and the surrounding module metalwork of the television. This low impedance path provides a short for circulating current in the exposed metalwork that diminishes or essentially eliminates EMI. The present invention allows a POD card to operate at room temperature without the need for a cooling fan through the heat sink metalwork.

14 Claims, 3 Drawing Sheets

ELECTROMAGNETIC INTERFERENCE SHIELD AND HEAT SINK APPARATUS

This application claims the benefit, under 35 U.S.C. § 365 of International Application PCT/US2004/042492, filed Dec. 15, 2004, which was published in accordance with PCT Article 21(2) on Nov. 10, 2005 in English and which claims the benefit of U.S. provisional patent application No. 60/533,325, filed Apr. 15, 2004.

BACKGROUND OF THE INVENTION

1. Field of the Invention

The present invention relates to the field of television receivers and, more particularly, to the use of point of distribution cards in television receivers.

2. Background Information

Starting in 2004, regulations require all television receivers (televisions) that want to carry a "Digital Cable Ready" label indicating that the television receiver is capable of receiving and decoding various digital cable television formats, must incorporate what is known as a Point of Distribution (POD) card. A POD card is similar to a smart card or PCMCIA card, such as are used in satellite television receivers and computers. The POD cards allow for as needed updating of the encryption that is used in the television receiver to protect the video content from unauthorized copying.

Present specifications for POD cards require the capability of handling two (2) separate encoded video paths. The encrypted data passing through the POD card is MPEG-2 format and must be decrypted using the decryption key in the POD card. Due to the high speed of the data, there can be up to 2.5 watts (W) of power dissipated by the POD card.

Moreover, due to the high speed of data, i.e. several megabytes per second, the internal clock edges are roughly 1 nanosecond, generating electromagnetic interference (EMI) harmonics up to 5 GHz. While this is not a significant problem for the portion of the POD card enclosed in the metalwork of the television chassis, an additional problem exists with respect to the unenclosed portion of the POD card as discovered by the present inventors and shown from various radiation tests.

The classical method of fixing a temperature problem is to either reduce the heat at the source or provide a fan to cool the device. In the present case, the 2.5 W dissipation of the POD card is a specification requirement. One thought was to use metal PCMCIA rails to help conduct the heat from the POD card to the metal enclosure of the television receiver. The cost of tooling such metal rails, however, is currently cost prohibitive.

While a fan could be used for cooling the POD card, the main disadvantage of a fan is the noise. Many televisions are used in places where such fan noise would be considered unacceptable. This is especially true for when the television is off.

From an EMI standpoint, the standard means of limiting the EMI from a POD card is to enclose the exposed portion of the card in a metal box. In order for the customer to change the POD card, the customer has to open the door. In critical applications, an interlock can be provided to ensure that the customer closes the door once the POD card is replaced. Although functional, tooling costs and complexity of the door is not an acceptable solution.

It is thus evident from the above discussion that what is needed is a manner of conducting heat from and shielding electromagnetic interference generated by a POD card, particularly, but not necessarily, with respect to or in a television receiver.

This need and others is accomplished through application of the principles of the subject invention and/or as embodied in one or more various forms and/or structures such as are shown and/or described herein.

SUMMARY OF THE INVENTION

The invention provides a combination heat sink and electromagnetic interference (EMI) shield for a point of distribution (POD) card. Configured metalwork of the combination heat sink and electromagnetic interference shield provides conduction of heat from the POD card. This eliminates the need for a fan at room temperatures. In addition, the configured metalwork of the combined heat sink and electromagnetic interference shield provides EMI shielding of a portion of the POD card that extends beyond a metal enclosure or wrap of a POD control module (e.g. an HDTV control module).

The present combination POD card heat sink and EMI shield includes a combined thermal transfer and electromagnetic (EM) conduction portion that provides thermal and EM coupling or contact between an enclosure of the POD card and the metal control module enclosure of a television. The combined thermal transfer and EM conduction portion provides a low impedance connection between the POD card and the surrounding module metalwork of the television. This low impedance path provides a short for circulating current in the exposed metalwork that diminishes or essentially eliminates EMI.

In one form, there is provided a combination heat sink and electromagnetic interference shield device for a POD card receptor of a television receiver. The device includes a POD card guide portion configured to be adjacent a POD card inserted into the POD card receptor of the television receiver, and a combined thermal transfer and electromagnetic conduction portion extending from the POD card guide portion, the combined thermal transfer and electromagnetic conduction portion providing thermal and electromagnetic coupling between the inserted POD card and metalwork of the television receiver.

According to another form, there is provided a combination heat sink and electromagnetic interference shield device for a POD card receptor of a television receiver. The device includes a first combination heat sink and electromagnetic interference shield, and a second combination heat sink and electromagnetic interference shield disposed opposite to the first combination heat sink and electromagnetic interference shield. The first combination heat sink and electromagnetic interference shield has a first POD card guide portion configured to be adjacent one side of a POD card inserted into the POD card receptor of the television receiver, and a first combined thermal transfer and electromagnetic conduction portion extending from the first POD card guide portion and providing thermal and electromagnetic coupling between the inserted POD card and metalwork of the television receiver. The second combination heat sink and electromagnetic interference shield has a second POD card guide portion configured to be adjacent another side of the POD card inserted into the POD card receptor of the television receiver and opposite to the first POD card guide receptor forming a POD card reception area therebetween, and a second combined thermal transfer and electromagnetic conduction portion extending from the second POD card guide portion and providing thermal and electromagnetic coupling between the inserted POD card and metalwork of the television receiver.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein.

Figure 1:
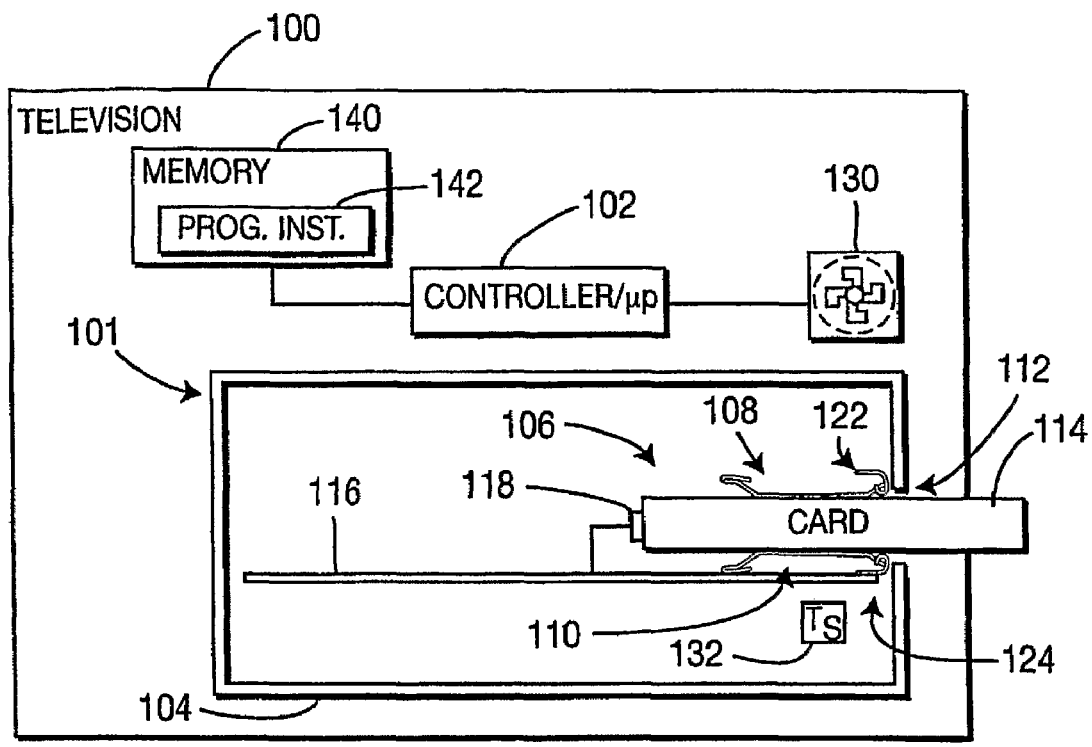
FIG. 1 is a simplified block diagram of an exemplary television receiver having a POD module shown in side view, the POD module incorporating a combination heat sink and electromagnetic interference shield assembly for a POD card in accordance with the principles of the present invention.
Figure 2:
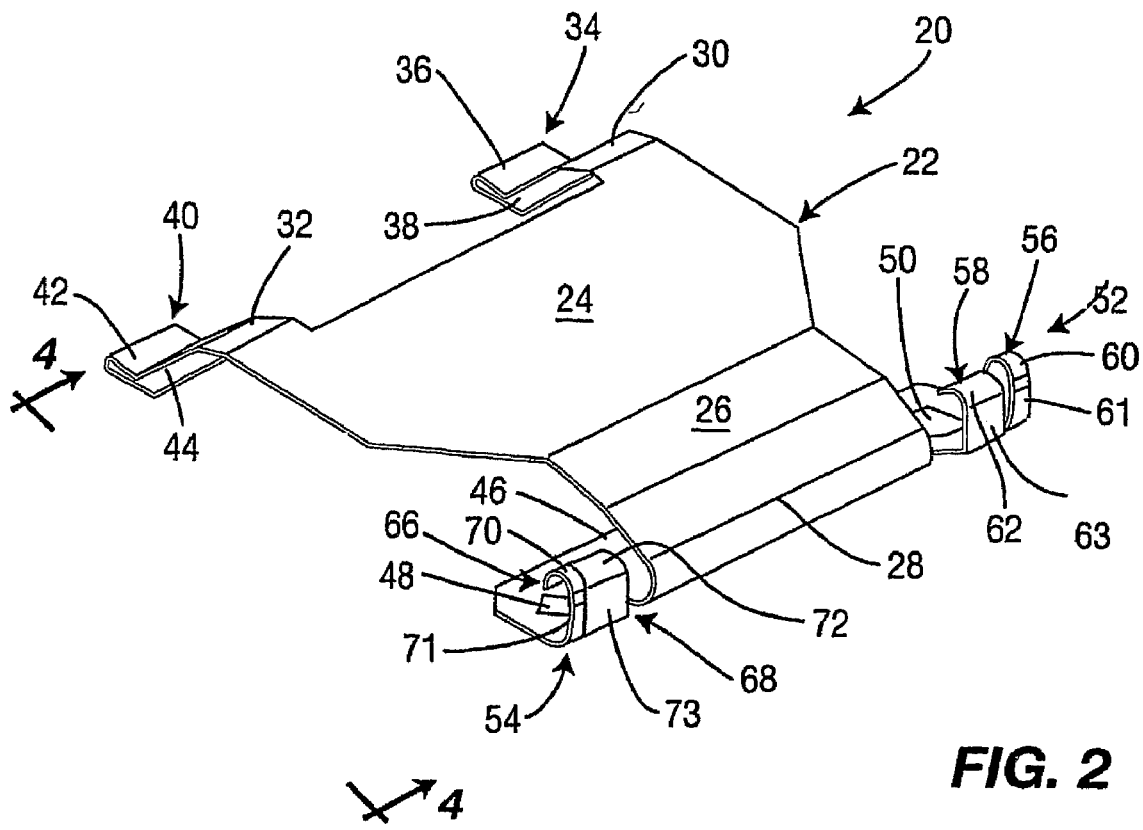
FIG. 2 is a perspective view of a combination heat sink and electromagnetic interference shield of the combination heat sink and electromagnetic interference shield assembly shown in FIG. 1.
Figure 3:
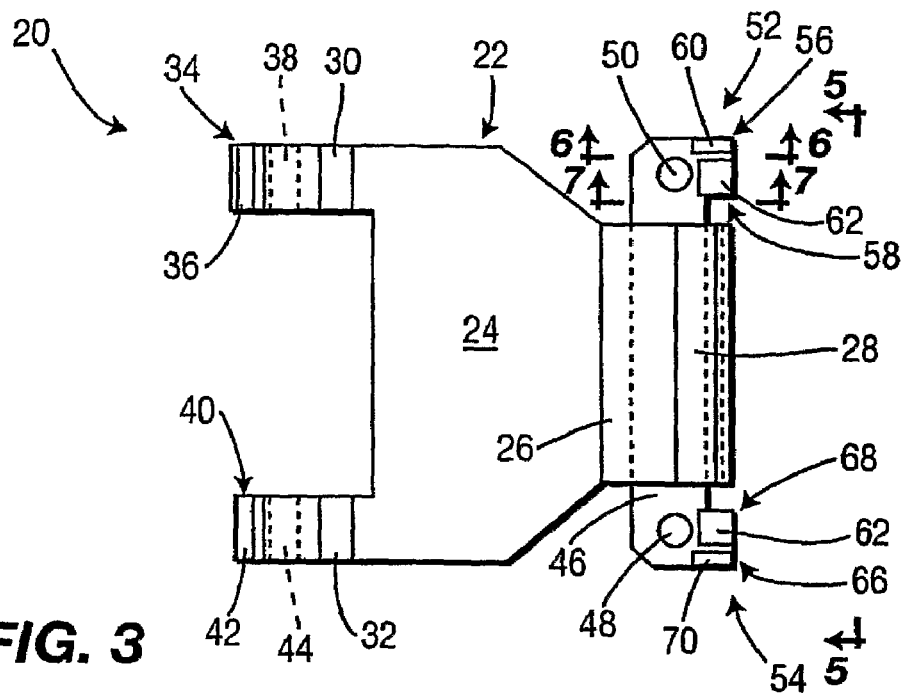
FIG. 3 is a top plan view of the combination heat sink and electromagnetic interference shield of FIG. 2.
Figure 4:
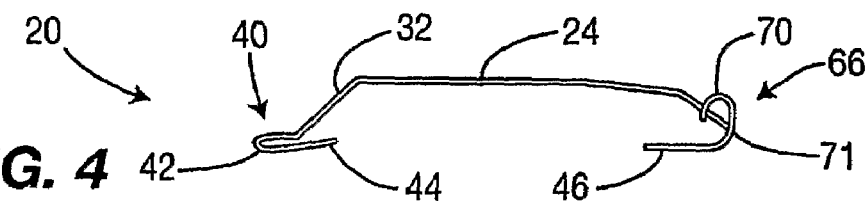
FIG. 4 is a side view of the combination heat sink and electromagnetic interference shield of FIG. 2 taken along line 4-4 of FIG. 2.

Corresponding reference characters indicate corresponding parts throughout the several views. Although the drawings represent embodiments of the invention, the drawings are not necessarily to scale and certain features may be exaggerated in order to better illustrate and explain the invention. The exemplification set out herein illustrates an embodiment of the invention, but such exemplification is not to be construed as limiting the scope of the invention in any manner.

DESCRIPTION OF THE PREFERRED EMBODIMENT

The embodiment disclosed herein is not intended to be exhaustive or limit the invention to the precise form disclosed so that others skilled in the art may utilize its teaching.

FIG. 1 illustrates an exemplary television receiver, generally designated 100. The television receiver 100 represents various types of devices that receive and process television signals but is particularly representative of a television. More particularly, the television receiver 100 is representative of a digital cable-ready television. It should be appreciated, however, that the present invention is applicable to all types of television receivers and as well to other electronic devices that utilize integrated circuit cards such as Point of Distribution (POD) cards, smart cards, PCMCIA cards, and the like.

It should be appreciated that the term POD card refers to all types of integrated circuit cards and cards comprising electronic circuitry such as are used in televisions, particularly such as for satisfying requirements for providing a digital cable-ready television/television receiver.

With continued reference to FIG. 1, the television 100 includes a processor/controller 102 such as is known in the art for operation and/or control of the various components, parts, or portions of the television 100. A controller (processor) 102 is shown that represents the ability of the television 100 to perform necessary television functions. Memory 140 is also provided that includes program instructions 142 for operation of the television 100 as set forth herein. The television 100 also includes other components such as are known in the art for televisions, but which are not shown, such as memory for storing operating instructions, data and/or the like.

The television 100 includes a digital television control module 101 such as an HDTV control module. The digital television control module 101 comprises a metal enclosure 104 that may be known as metalwork or a wrap. The metalwork 104 is composed of a metal suitable for heat conduction and electromagnetic interference (EMI) shielding. The television 100 and metalwork 104 include an opening for a POD card 114.

The enclosure 104 houses a printed circuit board (PCB) 116 that carries various circuitry/components for operation of the control module 101. The PCB 116 represents one or more PCBs if desired. A POD card connector 118, that may be the same as or similar to a PCMCIA connector, is connected to the PCB 116 and is adapted, configured to operable to receive an appropriate end of the card 114. In accordance with the principles of the present invention, a combination heat sink and EMI shield component or assembly 106 is situated on or proximate to the PCB 116. The combination heat sink and EMI shield 106 forms a card receptor, reception area, holder, receiver, slot, chamber or the like 112. The card 114 is thus accommodated by the combination heat sink and EMI shield 106.

The combination heat sink and EMI shield 106 for the card 114 is embodied as two combination heat sink and EMI shield components 108 and 110. Each one of which includes a combined thermal transfer and electromagnetic (EM) conduction portion 122 and 124 respectively, that provides thermal and EM coupling or contact between an enclosure of the POD card and the metal control module enclosure 104 of the television 100. Each conduction portion 122 and 124 has a section or portion which contacts or thermally and electromagnetically couples with the POD card 114 (when received in the channel 112) and a portion of which contacts or thermally and electromagnetically couples with the metalwork 104. In this manner, the portions 122 and 124 provide a thermal and electromagnetic path from the POD card 114 and the metalwork 104. The combined thermal transfer and EM conduction portions 122 and 124 provide low impedance connections between the POD card and the surrounding module metalwork of the television. This low impedance path provides a short for circulating current in the exposed metalwork that diminishes or essentially eliminates EMI.

The television 100 is shown including a POD card fan 130 that is connected to and controlled by the controller 102 in conjunction with the program instructions 142. A temperature sensor (TS) 132 may also be provided that is coupled to the PCB 116 and operable to provide ambient temperature readings. The controller 102 utilizes the temperature readings of the temperature sensor 132 to determine if the fan 130 should be turned on or off. In accordance with the principles of the present invention, the combination heat sink and EMI shield 106 is capable of adequately dissipating heat from the POD card 114 at or around room temperatures and thus at room temperatures, the fan 130 is off. The fan is thus kept off until the room ambient temperature is around 80° F. The controller 142 is thus operable to turn the fan on when ambient temperatures are above room temperature. The instrument specification requires that the instrument run to 40° C., so the fan has to be able to keep the POD case temperature to <65° C. in a 40° C.

Referring to FIGS. 2-7, an exemplary combination heat sink and electromagnetic interference (EMI) shield device 20 (combination heat sink and EMI shield 20) such as is usable with or as the combination head sink and EMI shield assembly 106 of FIG. 1 is depicted. The exemplary device 20 represents either one of the upper and lower devices, members or components 108 and 110 of the combination heat sink and EMI shield assembly 106 since only one such combination heat sink and EMI shield device may be sufficient to constitute the combination heat sink and EMI shield assembly 106, or, and as shown in the preferred embodiment of FIG. 1, with the use of a pair of identical combination heat sink and EMI shield devices 108 and 110.

The combination heat sink and EMI shield device, component or member 20 is characterized by a body 22 that is fabricated from a material that provides heat sink properties and EMI shielding properties such as a metal. An exemplary metal may be a phosphor bronze or a beryllium copper. Other metals or materials may, of course, be utilized. The body 22 includes a section 24 that forms a side of the reception area 112. Extending from an end of the section 24 are two angled legs 30 and 32 which each terminate in feet 34 and 40 respectively. Foot 34 is defined by a front portion 36 and a rear portion 38. Foot 40 is defined by a front portion 42 and a rear portion 44. As best seen in FIG. 1, a foot may be used to stabilize the combination heat sink and EMI shield device on a PCB or otherwise.

Extending from an end of the section 24 opposite the legs 30 and 32 is a first angled section 26 and a second angled section 28. The second angled section is configured so as to extend or turn underneath and back around so as to be somewhat to substantially co-planar with the section 24 to define an elongated end tab 46. The elongated end tab 46 optionally a first mounting hole 48 at one end thereof, and a second mounting hole 50 on another end thereof. These mounting holes may be used to attach the device 20 to the PCB 116 either directly or via standoffs (not shown) typically via screws or other fasteners.

In accordance with the principles of the subject invention, the combination heat sink and EMI shield device 20 includes a first combination thermal transfer and electromagnetic (EM) conduction portion 52 and a second combination thermal transfer and electromagnetic (EM) conduction portion 54, each of which provides thermal and EM coupling or contact between the POD card 114 and the metal control module enclosure 104.

The first combination thermal transfer and EM conduction portion 52 includes an outer, curved prong 56 and an inner curved prong 58. The second combination thermal transfer and EM conduction portion 54 likewise includes an outer, curved prong 66 and an inner curved prong 68. Each prong is adapted, configured and/or operable to provide a heat conduction and EM path between the card 114 and the enclosure 104. Particularly, each prong is adapted, configured and/or operable to contact and thus provide thermal and EM coupling with the enclosure or housing of the card 114 and with the enclosure 104.

The outer prong 56 of the first combination thermal transfer and EM conduction portion 52 has a card contact portion 60 and an enclosure contact portion 61. The inner prong 58 of the first combination thermal transfer and EM conduction portion 52 has a card contact portion 62 and an enclosure contact portion 63. Likewise, the outer prong 66 of the second combination thermal transfer and EM conduction portion 54 has a card contact portion 70 and an enclosure contact portion 71, while the inner prong 68 of the second combination thermal transfer and EM conduction portion 54 has a card contact portion 72 and an enclosure contact portion 73.

Figure 5:
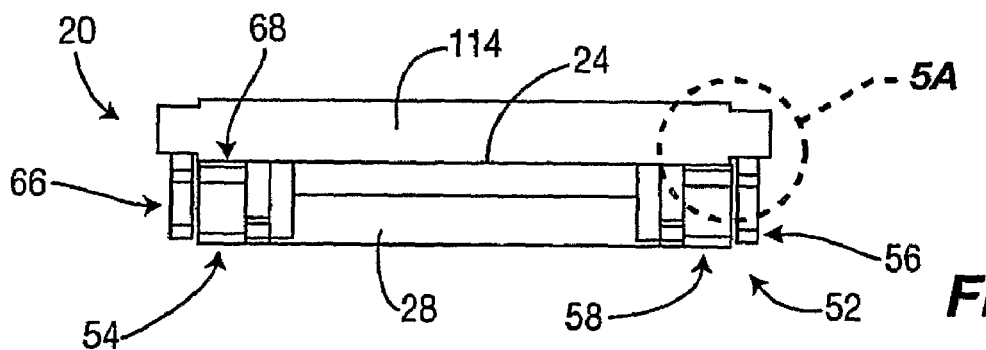
FIG. 5 is an end view of the combination heat sink and electromagnetic interference shield of FIG. 2 taken along line 5-5 of FIG. 3 especially in relation to a POD card shown therewith.
Figure 5A:
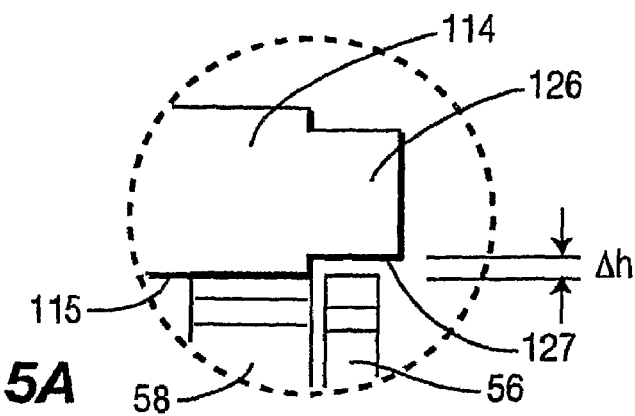
FIG. 5A is an enlarged view of the POD card and prongs of the combination heat sink and electromagnetic interference shield taken along circle 5A of FIG. 5.

FIG. 5 shows a POD card 114 in relation to the combination heat sink and EMI shield device 20 to illustrate the manner in which an inserted POD card is situated relative to one combination heat sink and EMI shield device 20. Referring additionally to FIG. 5A, the current POD card case configuration is shown and particularly with respect to the prongs 56 and 58. The POD case includes a narrowed section 126 on both sides thereof, defining an undersurface 127. The undersurface 127 is a distance $\Delta h$ from the undersurface 115 of the POD case. As such, the prong 56 is $\Delta h$ greater in height than the prong 58. It should be appreciated that the same relationships hold for the combination thermal transfer and EM conduction portion 54. The difference in height of the outer prongs 56 and 66 relative to the inner prongs 58 and 68, creates or defines a channel that guides the POD card due to the configuration of the POD card case.

Figure 6:
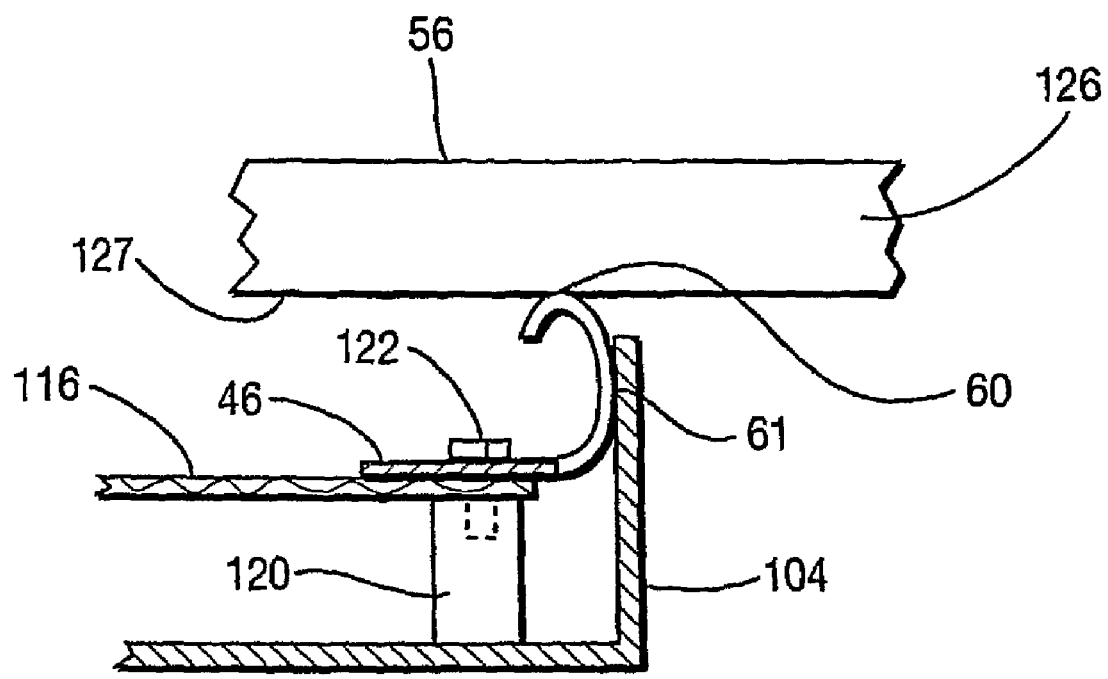
FIG. 6 is a sectional view of the combination heat sink and electromagnetic interference shield of FIG. 2 taken long line 6-6 of FIG. 3 particularly showing the outer prong thereof, the outer prong illustrated with reference to a manner of mounting, particularly showing the outer prong with a POD card, printed circuit board and module enclosure.

FIG. 6 particularly shows the configuration of the outer prong 56 of the first combination thermal transfer and EM conduction portion 52 as it contacts the POD card case. It should be appreciated from the above, that the outer prong 66 of the second combination thermal transfer and EM conduction portion 54 has the same configuration. The contact portion 60 of the outer prong 56 is configured for contact or coupling with the card case surface 127 of the portion 126, while the contact portion 61 of the outer prong 56 is configured for contact or coupling with the metalwork 104, or other metalwork of the television 100 as appropriate.

Moreover, FIG. 6 shows the structure 46 and prong 56 as mounted to a standoff 120 via a screw 122 or the like. The screw 122 extends through hole 50 (see FIG. 3) of portion 46. The PCB 116 is also preferably situated between the portion 46 and the standoff 120. The screw 122 and standoff 120 are at least thermally conductive (and optionally electromagnetically) to aid in heat transfer to the enclosure 104, or EMI as the case may be.

Figure 7:
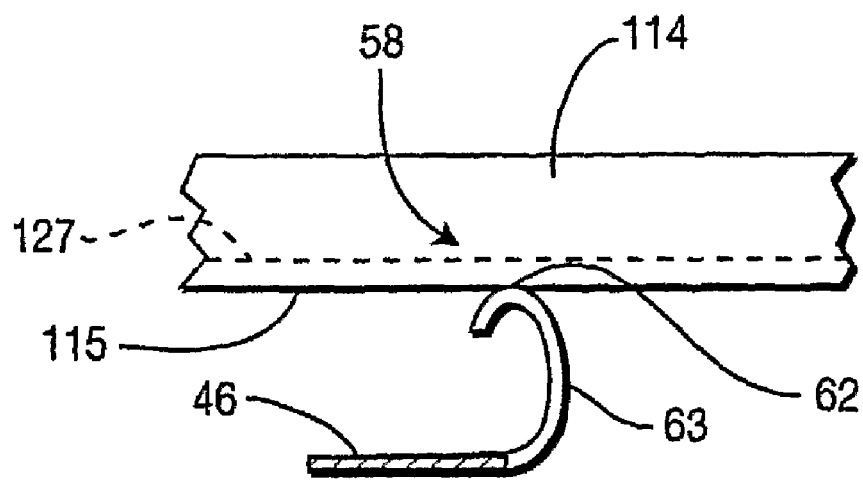
FIG. 7 is a sectional view of the combination heat sink and electromagnetic interference shield taken along line 7-7 of FIG. 3 particularly showing the inner prong thereof, the inner prong illustrated with reference to an inserted POD card.

FIG. 7 particularly shows the configuration of the inner prong 58 of the first combination thermal transfer and EM conduction portion 52. It should be appreciated from the above, that the inner prong 68 of the second combination thermal transfer and EM conduction portion 54 has the same configuration. The contact portion 62 of the inner prong 58 is configured for contact or coupling with the card case surface 115, while the contact portion 63 of the inner prong 58 is configured for contact or coupling with the metalwork, or other metalwork of the television 100 as appropriate (not shown).

It should be further appreciated that the specific configuration of portions or parts of the combination heat sink and EMI shield device 20 may deviate from that which is shown. This includes the configuration of the prongs or heat and EM conductors.

While this invention has been described as having a preferred design, the present invention can be further modified within the spirit and scope of this disclosure. This application is therefore intended to cover any variations, uses, of adaptations of the invention using its general principles. Further, this application is intended to cover such departures from the present disclosure as come within known or customary practice in the art to which this invention pertains and that fall within the limits of the appended claims.

The invention claimed is:

1. A device comprising:
   an integrated circuit card guide portion configured to be adjacent an integrated circuit card inserted into an integrated circuit card receptor of a television receiver; and
   a combined thermal transfer and electromagnetic conduction portion extending from the integrated circuit card guide portion, the combined thermal transfer and electromagnetic conduction portion providing thermal and electromagnetic coupling between the inserted integrated circuit card and metalwork of the television receiver.

2. The device of claim 1, wherein the integrated circuit card guide portion and the combined thermal transfer and electromagnetic conduction portion are formed from a thermally and electromagnetically conductive material.

3. The device of claim 1, wherein the combined thermal transfer and electromagnetic conduction portion includes a plurality of first surfaces configured to contact the integrated circuit card and a plurality of second surfaces configured to contact the metalwork.

4. The device of claim 1, wherein the combined thermal transfer and electromagnetic conduction portion comprises a plurality of arcuate prongs defining the plurality of first surfaces configured to contact the integrated circuit card and the plurality of second surfaces configured to contact the metalwork 5. The device of claim 1, wherein the combined thermal transfer and electromagnetic conduction portion comprises:
   a first side portion defining a first outer prong and a first inner prong;
   a second side portion opposite the first side portion and defining a second outer prong and a second inner prong;
   the first and second outer prongs contacting a first surface of an inserted integrated circuit card case, and the first and second outer prongs contacting a second surface of the inserted integrated circuit card case.

6. The device of claim 5, wherein the first and second outer prongs have a greater height than the first and second inner prongs.

7. The device of claim 1, further comprising:
   a pair of legs extending from the integrated circuit card guide portion opposite to the combined thermal transfer and electromagnetic conduction portion.

8. A device comprising:
   a first combination heat sink and electromagnetic interference shield; and
   a second combination heat sink and electromagnetic interference shield disposed opposite to the first combination heat sink and electromagnetic interference shield;
   the first combination heat sink and electromagnetic interference shield having a first integrated circuit card guide portion configured to be adjacent one side of an integrated circuit card inserted into an integrated circuit card receptor a television receiver, and a first combined thermal transfer and electromagnetic conduction portion extending from the first integrated circuit card guide portion and providing thermal and electromagnetic coupling between the inserted integrated circuit card and metalwork of the television receiver; and
   the second combination heat sink and electromagnetic interference shield having a second integrated circuit card guide portion configured to be adjacent another side of the integrated circuit card inserted into the integrated circuit card receptor of the television receiver and opposite to the first integrated circuit card guide receptor forming a integrated circuit card reception area therebetween, and a second combined thermal transfer and electromagnetic conduction portion extending from the second integrated circuit card guide portion and providing thermal and electromagnetic coupling between the inserted integrated circuit card and metalwork of the television receiver.

9. The device of claim 8, wherein the first and second combination heat sink and electromagnetic interference shields are substantially identical.

10. The device of claim 8, wherein the first and second combination heat sink and electromagnetic interference shields is formed of a thermally and electromagnetically conductive material.

11. The device of claim 8, wherein the first and second combined thermal transfer and electromagnetic conduction portions include a plurality of first surfaces configured to contact the integrated circuit card and a plurality of second surfaces configured to contact the metalwork.

12. The device of claim 11, wherein the first and second combined thermal transfer and electromagnetic conduction portions comprise a plurality of arcuate prongs defining the first and second contact surfaces.

13. The device of claim 8, wherein:
   the first combined thermal transfer and electromagnetic conduction portion includes,
      a first outer prong and a first inner prong; and
   the second combined thermal transfer and electromagnetic conduction portion includes,
      a second outer prong and a second inner prong, wherein
   the first and second outer prongs are adapted to contact a first surface of an integrated circuit card case, and the first and second outer prongs adapted to contact a second surface of the integrated circuit card case.

14. The device of claim 13, wherein the first and second outer prongs have a greater height than the first and second inner prongs.

* * * * *